(12) United States Patent
Prodic et al.

(10) Patent No.: US 7,821,431 B2
(45) Date of Patent: Oct. 26, 2010

(54) UNIVERSAL AND FAULT-TOLERANT MULTIPHASE DIGITAL PWM CONTROLLER FOR HIGH-FREQUENCY DC-DC CONVERTERS

(75) Inventors: Aleksandar Prodic, Toronto (CA); Zdravko Lukic, Toronto (CA)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 12/706,256

(22) Filed: Feb. 16, 2010

(65) Prior Publication Data

US 2010/0141349 A1 Jun. 10, 2010

Related U.S. Application Data

(62) Division of application No. 11/773,324, filed on Jul. 3, 2007, now Pat. No. 7,667,625.

(60) Provisional application No. 60/892,109, filed on Feb. 28, 2007.

(51) Int. Cl.
*H03M 1/48* (2006.01)
(52) U.S. Cl. ...................................... 341/113; 341/145
(58) Field of Classification Search .......... 341/140–170
See application file for complete search history.

(56) References Cited

U.S. PATENT DOCUMENTS

| | | | |
|---|---|---|---|
| 6,833,691 B2 | 12/2004 | Chapuis | |
| 7,271,754 B2* | 9/2007 | Maksimovic et al. | ........ 341/152 |
| 7,667,625 B2* | 2/2010 | Prodic et al. | ................... 341/50 |
| 2005/0135023 A1 | 6/2005 | Goder et al. | |
| 2006/0022656 A1 | 2/2006 | Leung et al. | |
| 2007/0285180 A1* | 12/2007 | Wu | .............................. 331/57 |

FOREIGN PATENT DOCUMENTS

WO WO 2006/037214 4/2006

OTHER PUBLICATIONS

U.S. International Searching Authority, International Search Report and Written Opinion for International Appln. No. PCT/2008/055028, dated Oct. 14, 2009, 11 pages.

* cited by examiner

*Primary Examiner*—Lam T Mai
(74) *Attorney, Agent, or Firm*—Fliesler Meyer LLP (57) ABSTRACT

A multiphase hybrid digital pulse width modulator can comprise a counter that is selectable between at least two different numbers of states to indicate a first portion of a switching period. Unclocked logic can indicate a second portion of the switching period. The unclocked logic can include a delay line.

17 Claims, 10 Drawing Sheets

UNIVERSAL AND FAULT-TOLERANT MULTIPHASE DIGITAL PWM CONTROLLER FOR HIGH-FREQUENCY DC-DC CONVERTERS

CLAIM OF PRIORITY

This is a Divisional application of U.S. patent application Ser. No. 11/773,324, filed Jul. 3, 2007, entitled "UNIVERSAL AND FAULT-TOLERANT MULTIPHASE DIGITAL PWM CONTROLLER FOR HIGH-FREQUENCY DC-DC CONVERTERS" by Aleksandar Prodic, et al., now U.S. Pat. No. 7,667,625, issued on Feb. 23, 2010 and claims priority to U.S. Provisional Application No. 60/892,109 entitled: "UNIVERSAL AND FAULT-TOLERANT MULTIPHASE DIGITAL PWM CONTROLLER FOR HIGH-FREQUENCY DC-DC CONVERTERS", by Aleksandar Prodic, et al., filed Feb. 28, 2007.

CROSS-REFERENCE TO RELATED APPLICATIONS

This application is related to the following application: U.S. patent application entitled "PROGRAMMABLE ANALOG-TO-DIGITAL CONVERTER FOR LOW-POWER DC-DC SMPS", by Amir Parayandeh et al., U.S. patent application Ser. No. 11/773,330 filed Jul. 3, 2007, now U.S. Pat. No. 7,652,604, issued on Jan. 26, 2010.

FIELD OF THE INVENTION

The present invention relates to a programmable digital pulse width modulators (DPWM).

BACKGROUND OF INVENTION

Multi-phase converters are widely used as power supplies for electronic devices. In computer systems, to provide regulated voltage for microprocessors, interleaved multi-phase topologies operating with 2 to 64 phases are often employed. They can provide regulated voltages ranging from 0.9V to 5V and supply a large amount of currents, which in some applications reaches 150 A. In modern TV sets and consumer electronics multiple converters are used to provide different supply voltages for various system blocks. Multi-phase converters operating in parallel can also be found in systems, whose power consumption increases in time. Examples include computer servers and large communication systems, where new system blocks (units) can be added to increase systems power delivery capabilities.

Traditionally, the controllers for these power supplies are implemented using application specific analog circuits. They usually require a large number of external passive elements for implementation and have proven to be prone to stability problems when operating with parallel converters. In addition, they are often designed to control a very specific power stage only.

As a valuable alternative digital controllers could be applied. In multi-stage converters advantages of digital controllers over traditional analog solutions are becoming more evident. Potentially, they can result in system realization with a smaller number of components, allow simpler introduction of novel power management and control techniques, such as dynamic and adaptive voltage scaling (AVS and DVS), and are easier for integration with other system parts that are predominantly digital.

The digital implementation of multi-phase pulse width modulators can bring advantages such as accurate matching of multiple pulse-width modulated signals and/or reduction of the output voltage ripple through phase shifting. However, compared to analog solutions most of the multi-phase digital pulse-width modulation (MDPM) architectures suffer from the problem of relatively high power consumption (from several tens to hundreds of milliwatts) that is linearly increasing with switching frequency. The high power is likely to hinder the use of most of the existing digital solutions in upcoming low-power converters, which are expected to operate at switching frequencies 10 to 100 times higher than the existing power stages. As a result, a significant reduction in converter efficiency can be expected. In addition, the utilization of flexibility of digital control has been limited to abovementioned applications. Even though digital control allows implementation of flexible architectures, application specific digital architectures that can be used only for specific types of multi-phase converters are usually used. Besides that, the IC realization of some of the proposed solutions is costly since they require a relatively large chip area.

Digital control of low-power switch-mode power supplies (SMPS) can result in significant improvements of the characteristics of power supply system used in applications such as communication systems, consumer electronics, portable devices, and computers. The advantages of digital control include flexibility, low sensitivity on external influences and realization with a small number of external passive components.

Digital implementation also simplifies implementation of power supplies. Analog controllers usually require time-consuming redesign every time characteristics of the supplied devices change, which in modern electronics happens often. On the other hand, modern tools for automatic digital design allow short development process and fast modification of existing designs to accommodate new requirements.

Although the advantages of the digital realizations are known, in low-power applications, analog pulse width modulator (PWM) controllers are mainly used.

One of the main reasons for the sporadic use of digital controllers is lack of low-power hardware solutions for digital-pulse width modulators (DPWM), the key parts of every voltage-mode pulse-width modulation controller. The DPWMs operate at high switching frequencies, which in existing switching converters exceed 1 MHz, and need to have high resolution. The high resolution is necessary for tight output voltage regulation and for elimination of undesirable limit-cycle oscillations of the output voltage and inductor current.

In existing DPWM solutions the power consumption is usually proportional to the product of switching frequency and resolution and, in some cases, exceeds the power consumed by the output load, resulting in poor overall efficiency of digitally controlled SMPS.

DETAILED DESCRIPTION

Figure 1:
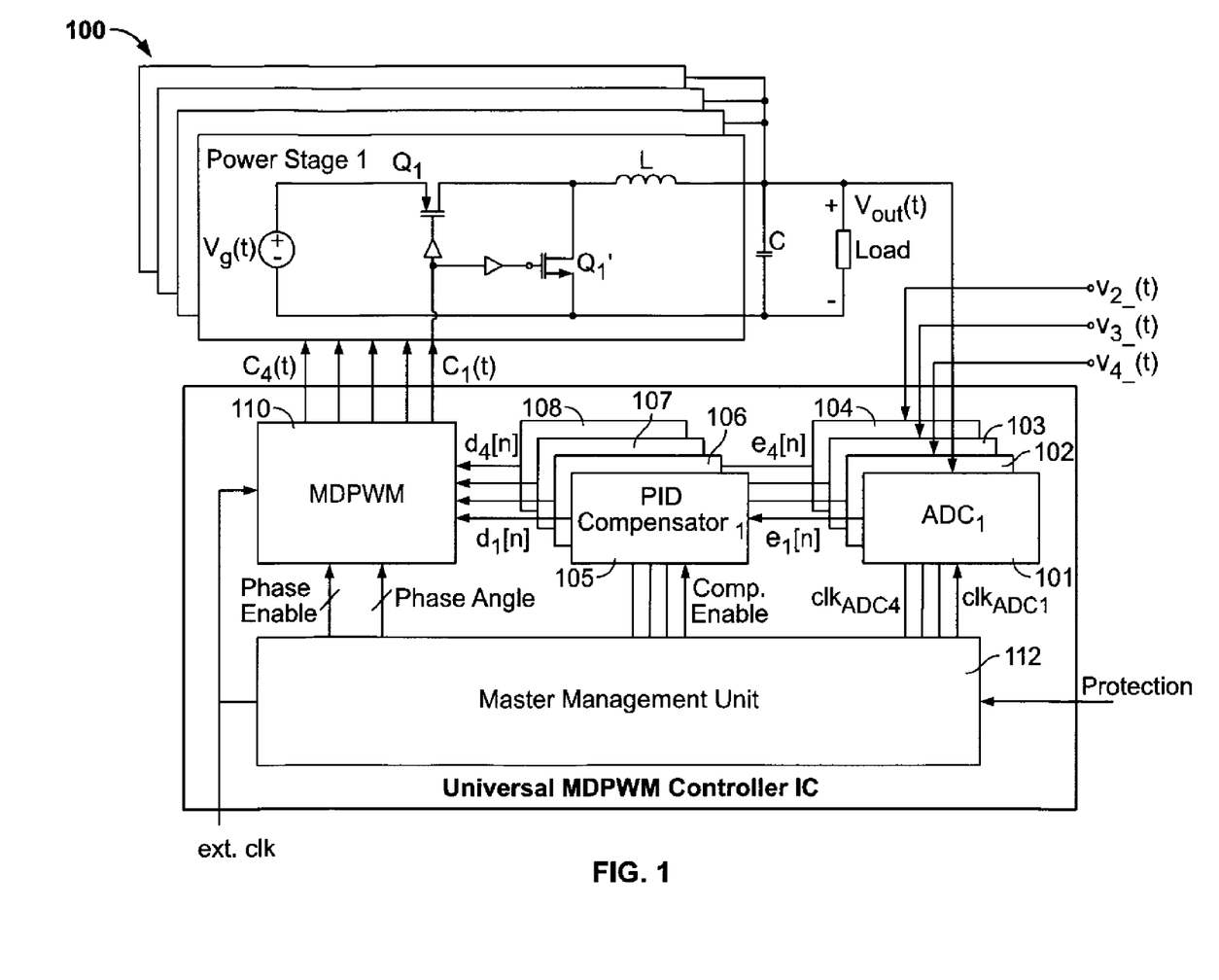
FIG. 1 shows a digital controller architecture of one embodiment.

FIG. 1 shows a universal digital controller architecture of one embodiment that can be implemented on a small chip area and has very low power consumption. In addition, the new architecture can exploit the flexibility of digital implementation. The controller can regulate operation of interleaved converters having 1 to 4 phases or/and regulate operation of up to 4 different converters with programmable output voltages. In one embodiment, the programmability of the number of the phases, phase shifts, and output voltages can allow this system to be used in various applications as well as system optimization, depending on power ratings, transient response, size, and cost. In interleaved mode the controller can tolerate failure of a phase and automatically switches to operation with reduced number of phases (for example, from 4 to 3) allowing uninterrupted operation until the problem is corrected. This feature is also extremely useful for converters operating with "phase dropping technique", where the number of phases is dynamically changed to dramatically improve overall efficiency of the converter. For such converters, practical digital converter implementation has not been proposed. Furthermore, this architecture can easily be modified for operation with multi-phase converters having larger number of phases, for example in 8 or 16-phase systems.

FIG. 1 shows universal controller regulating operation of a four-phase interleaved buck converter. The controller can comprise four analog-to-digital converters (ADCs) 101, 102, 103 and 104 with digitally adjustable reference, four programmable PID compensators 105, 106, 107 and 108, a flexible MDPWM 110, and master management block 112. The analog to digital converters can be implemented with a one-bit sigma-delta DAC and delay line or voltage-controlled oscillator based ADC combined to reduce the size of on-chip DAC filters by utilizing natural averaging of the delay line or other voltage-to-time structures, as described in the patent application SIPEX 1016US0, incorporated by reference.

A master management block 112 can set the mode of the chip operation by either connecting each of the ADCs with a single compensator or setting controller in interleaved mode. It can also produce clock signals for ADC converter, perform adjustments of phase shifts, and shut down critical phases if an external over-current or thermal protection signals are received.

Figure 2:
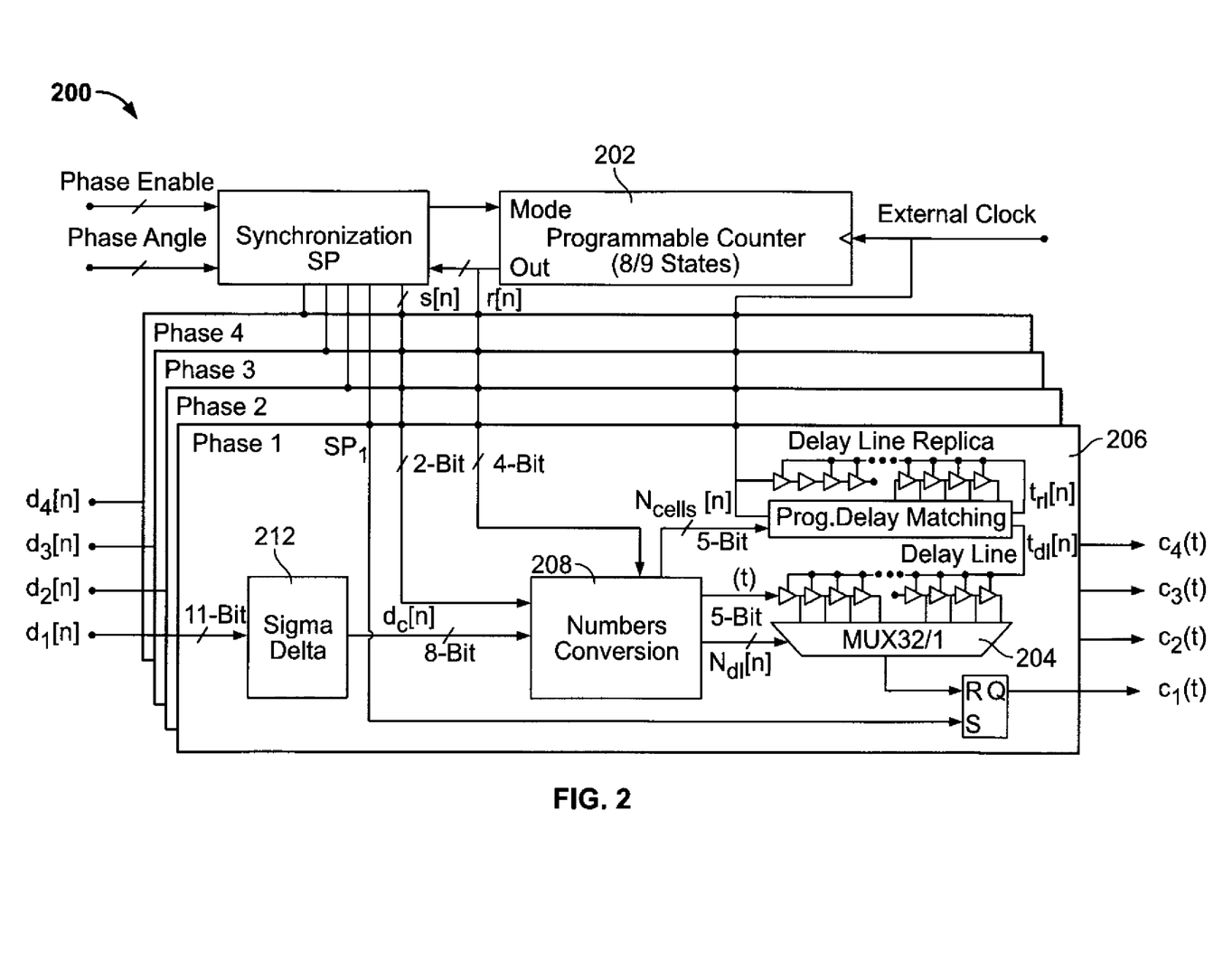
FIG. 2 is a diagram of a multiphase digital pulse width modulator of one embodiment.

FIG. 2 shows an exemplary multi-phase digital wavelength modulator 200.

One embodiment of the present invention is a multiphase hybrid digital pulse width modulator 200 comprising clocked logic, such as programmable counter 202, to indicate a first portion of a switching period and unclocked logic to indicate a second portion of the switching period.

The unclocked logic can include a delay line 204 including digitally programmable delay cells adjustable with a digital correction signal. A delay matching circuit can use a delay line replica 206 to produce a digital correction signal for synchronization with an external clock and/or for linearization of the DPWM's input-to-output characteristic. The output signal can be produced with a duty cycle determined from the first and second portion. The output signal can be one of multiple output signals each having a different phase.

Figure 6:
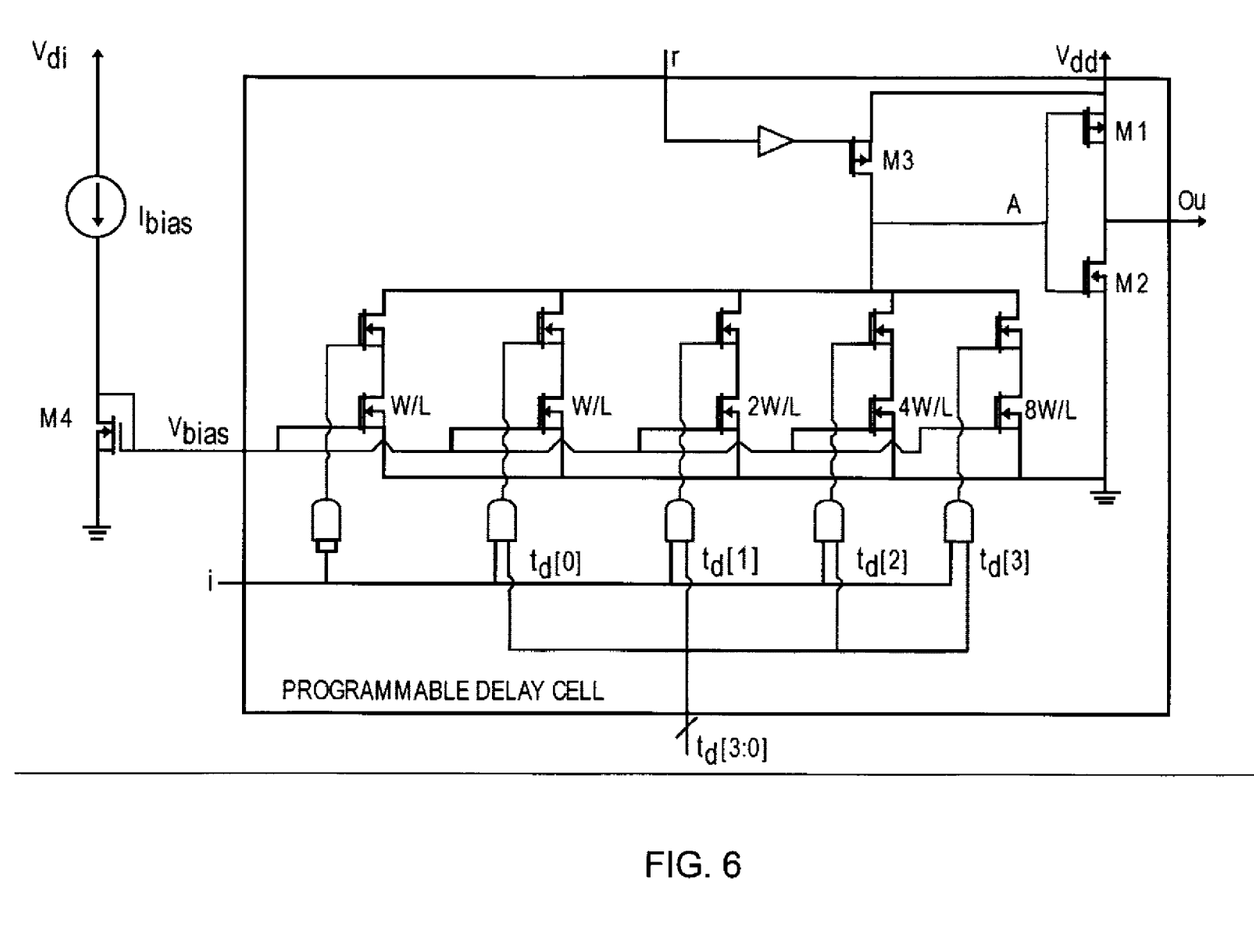
FIG. 6 is a diagram of a digitally programmable delay cell of one embodiment.
Figure 7:
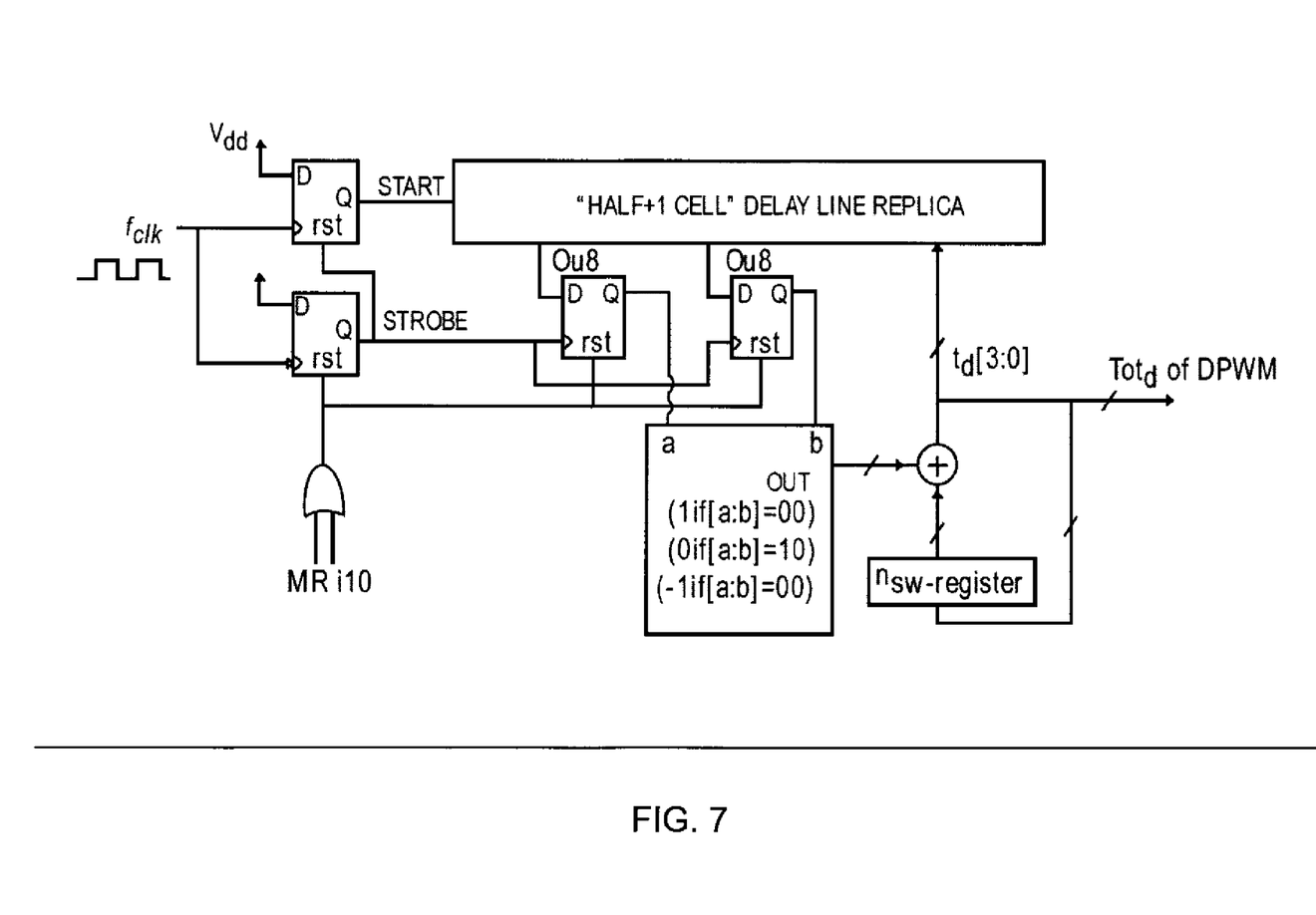
FIG. 7 is a diagram of a delay matching block of one embodiment.

As shown in FIG. 6, the digitally programmable delay cells can have the delay adjusted by tuning on or off transistors in the delay cell. In one embodiment, the transistors are in parallel. The digital correction signal can be a multi-bit value which turns on or off different sized transistors in the delay cells and in that way varies their propagation time.

The delay line replica 206 can be used to set the speed of the delay cells. The delay line 204 can be associated with a multiplexer that produces an output after the second portion. The hybrid digital pulse width modulator can have odd number of phases such that a programmable counter 202 of the clocked logic has a number of states divisible by the number of phases. The number of phases can be three. A number conversion circuit 208 can be used to convert a digital input into a counter state value and a delay line value.

One embodiment of the present invention is a multiphase hybrid digital pulse width modulator having a three phases such that the programmable counter has a number states divisible by three. A number conversion circuit 208 can be used to convert a digital value into a number of counter states and a number of delay line values.

The programmable counter 202 can be selectable between eight and nine states. Nine states can be used with a three phase operation, and eight states can be used with one, two and four phase operation.

The number conversion circuit 208 can be a lookup table to convert an input value to an output value. For example, 8 bits gives 256 possible inputs. This can be implemented with 8 counter states×32 delay lines states. When nine counter states are used, this gives 9×32=288 possible values that can be selected. The number conversion circuit 208 can convert between the 8 bit input and the 288 selectable output values.

One embodiment of the present invention is a counter 202 that is selectable between at least two states to indicate a first portion of a switching period and unclocked logic to indicate a second portion of the switching period. The unclocked logic can include a delay line 104. The multiphase hybrid digital pulse width modulator can have a selectable number of phases one which can be three.

One embodiment is a 4-phase digital pulse-width modulator PWM architecture and a controller that can be used with interleaved, multi-output, and parallel dc-dc switching converters operating at frequencies up to 10 MHz. The controller and modulator can be programmed to operate with any number of phases and be fault-tolerant. If during interleaved mode a failure in one of the phases occurs, the system can automatically switch to operation with reduced number of phases by disabling the critical phase and adjusting the angles of the remaining ones. A multi-phase digital-pulse width modulator (MDPWM) can comprise of programmable counter and delay line, a block for frequency synchronization and linearization, and a logic unit with changeable numbers representation.

The architecture of the MDPWM shown in FIG. 2 can be based on a modification of single-phase hybrid DPWM realization, disclosed in the patent application Ser. No. 11/359, 045 incorporated herein by reference, in which a low-resolution counter and delay line are used to create a pulse-width modulated signal. In this case, all phases can share the same programmable counter and a synchronization block. Each of the phases can contain a Sigma-delta (Σ-Δ) modulator 212, a programmable delay line 204 and its replica 206, a delay matching circuit and a number conversion block 208 with variable logic. The system can be clocked by an external signal whose frequency never exceeds nine times the switching frequency making MDPWM chip's power consumption very low.

At the beginning of a switching cycle, in each of the phases, a set pulse for RS latch can be created and its duration, i.e. duty cycle, can be varied using the counter and delay lines that reset the latch. The core steps of the desired 11-bit duty ratio value $d_i[n]$ can be set by the counter, fine adjustments can be performed through delay lines, and even finer ones with the sigma-delta modulator.

In the implementation, shown in FIG. 2, the counter 102 can set increments of duty ratio proportional to the three most significant bits (MSB) of the 11-bit input, the delay lines increments can be adjusted with the following 5 bits, and the remaining 3 least significant bits (3-LSB) can perform fine tuning of the duty ratio, through a sigma-delta modulator.

Figure 3A:
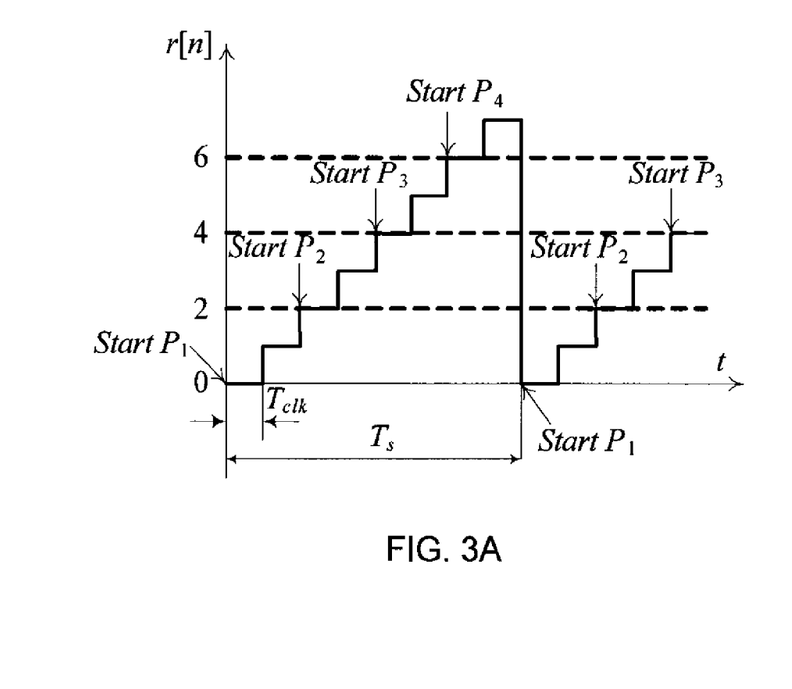
FIG. 3 shows four and three phase operation of a counter having eight and nine states respectively.
Figure 3B:
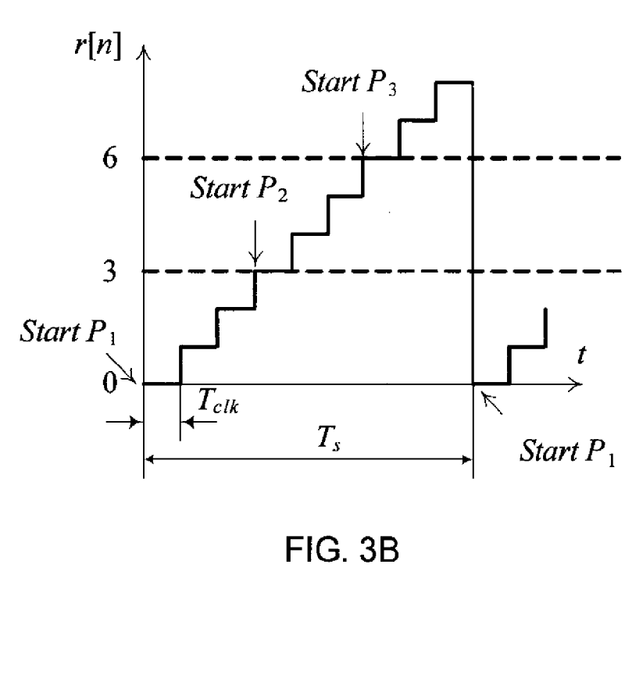

The mode of MDPWM operation can depend on phase enable and phase angle signals, which can select the combination of active phases and the angles between them, respectively. When the number of selected phases is 1, 2 or 4 the programmable counter can be set to count from 0 to 7 (FIG. 3*a*). When operating with 3 phases the counter can gradually change its output from 0 to 8, as shown in FIG. 3B. Based on the value of phase angle signal, the synchronization block can create set pulses for SR latches labeled as sp, FIGS. 3A and 3B illustrate interleaved operation with 4 and 3 phases, i.e. phase shifts of 90° and 120°, respectively.

The number conversion logic can change the way binary numbers are interpreted to achieve control over duty ratio value when 3-phase operation is required.

The delay line replica and programmable delay matching circuit can be used to eliminate possible nonlinearity problems characteristic for similar hybrid DPWM structures and to eliminate the need for Delay Locked Loop (DLL) and Phase Lock Loop (PLL) structures, which often suffer from stability problems. The advantage is that, in this case, the adjustment of delay line propagation time can be performed "off-line", meaning that a possible jitter in replica can be recognized and eliminated so the problem does not affect the delay line itself.

The sigma-delta can be used to vary the 8 bit output over time such that the PWM output names vary over time with an average value related to the 11 bit input.

When operating in the single phase mode or with even number of phases, the creation of duty ratio value proportional to the 8-bit control input $d_c[n]$ (see FIG. 2) can be simple. Counter passes through eight cycles and its steps, i.e. value $r[n]$, can be easily represented with 3-MSBs of the control word, leaving the remaining 5-LSBs for a finer duty ratio regulation using a 32-cell long delay line (see FIG. 2).

In the 3-phase mode, the situation is more complex. Now, in each switching cycle the counter goes through 9 steps resulting in 288 possible values of duty ratio, i.e. 9 counter values×32 delay line values. This number is higher than the number of possible 8-bit $d_c[n]$ inputs. As the result a problem of assigning an input $d_c[n]$ to appropriate combination of control signals for the counter and delay line exists. If wrongly assigned, the input value can result in non-linear or even non-monotonic input-to-output characteristic and consequent cause stability problems. Hence, in order to generate a linear and monotonic characteristic, for each input value $d_c[n]$, we need to define proper portions of duty ratio increments created by counter and delay line.

Let us define the counter and delay line increments as $\Delta D_{cn} = N_{cn}[n]/9$ and $\Delta D_{dl} = N_{dl}[n]/288$, respectively, where $N_{cn}[n]$ is a 4-bit value controlling the number of counter steps before the delay line is triggered and $N_{dl}[n]$ a 5-bit value defining the number of delay cells as shown in FIG. 2. To define these two numbers for each $d_c[n]$ we use minimum average error criteria. More precisely, we look for the minimum of the following function representing the relative error in $d_c[n]$ representation:

$$\Delta_d = \frac{d_c[n]}{256} - \left(\frac{N_{cn}[n]}{9} - \frac{N_{dl}[n]}{288}\right) \quad (1)$$

Figure 4:
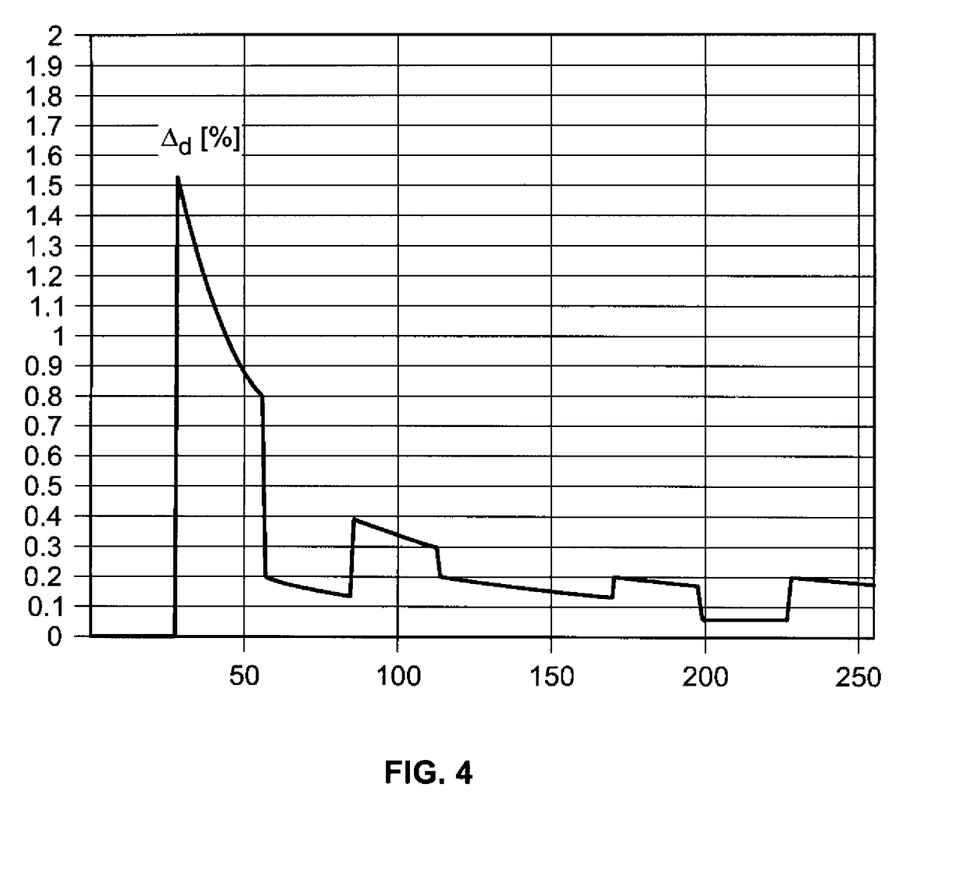
FIG. 4 shows a relative error value of a number converter of one embodiment.

The solution of this equation give a set of 256 values of $N_{cn}[n]$ and $N_{dl}[n]$ that result in the error distribution shown in FIG. 4. These values can be stored in two look-up tables and used for creation of proper increment portions during 3-phase operation.

In one example, a most significant bits (MSB) portion of a duty ratio input is sent to clocked logic that can count out a number of clock periods equal to the MSB values to indicate the first portion. The unclocked logic can use a least significant bits (LSB) portion of the duty ratio input to indicate a second portion that is a portion of a clock signal period long. The first and second periods can be combined to produce the DPWM output.

For example, an 8 bit duty ratio input can have 3 most significant bits that correspond to 0-7 clock periods for the first period, the 5 least significant bits can indicate from $0/32^{th}$ to $31/32^{th}$ of a clock period for the second period of delay.

Each delay cell can provide $1/32^{th}$ of a clock period delay. The delay cells can be digitally adjusted to maintain approximately a constant delay despite process and temperature variations.

The delay matching circuit can be used to digitally adjust the delay cells. In one embodiment, a delay line replica can be used to test whether the delay cells are running fast, running slow, or are running close to the correct speed. For example, the delay line replica can use a fixed period, such as clock period, or a half clock period when the clock signal has an accurate 50% duty cycle, to test how many digitally programmable delays cells the test signal passes through in the fixed period. If the test signal goes through too many delay cells in the delay line, the digital signal to the digitally adjustable delay cells is changed to reduce the delay of each delay cell. If the test signal goes through too few digitally programmable delay cells in the delay line replica, the digital correction signal to the digitally programmable delay cells is adjusted to increase the delay.

In one embodiment, we describe a self-calibrating high-frequency digital-pulse width modulator (DPWM) that can eliminate a number of problems and can have the characteristics listed below:

It can be implemented with a simple and low-power digital hardware

It can have a stable operation over a very wide range of adjustable constant switching frequencies, which span from several kHz to several MHz It can have linear and monotonic input-to-output characteristic It can have constant high resolution and full range of duty ratio values, i.e. 0 to 1, over the whole range of operating conditions.

Unlike some embodiments of the presented invention, other DPWM architectures do not combine all of these properties in a single architecture. Hence, each of them suffers from one or more problems such as excessive power consumption, low switching frequency and/or resolution, large chip area required for realization, variable switching frequency of operation, and unstable operation.

Figure 5:
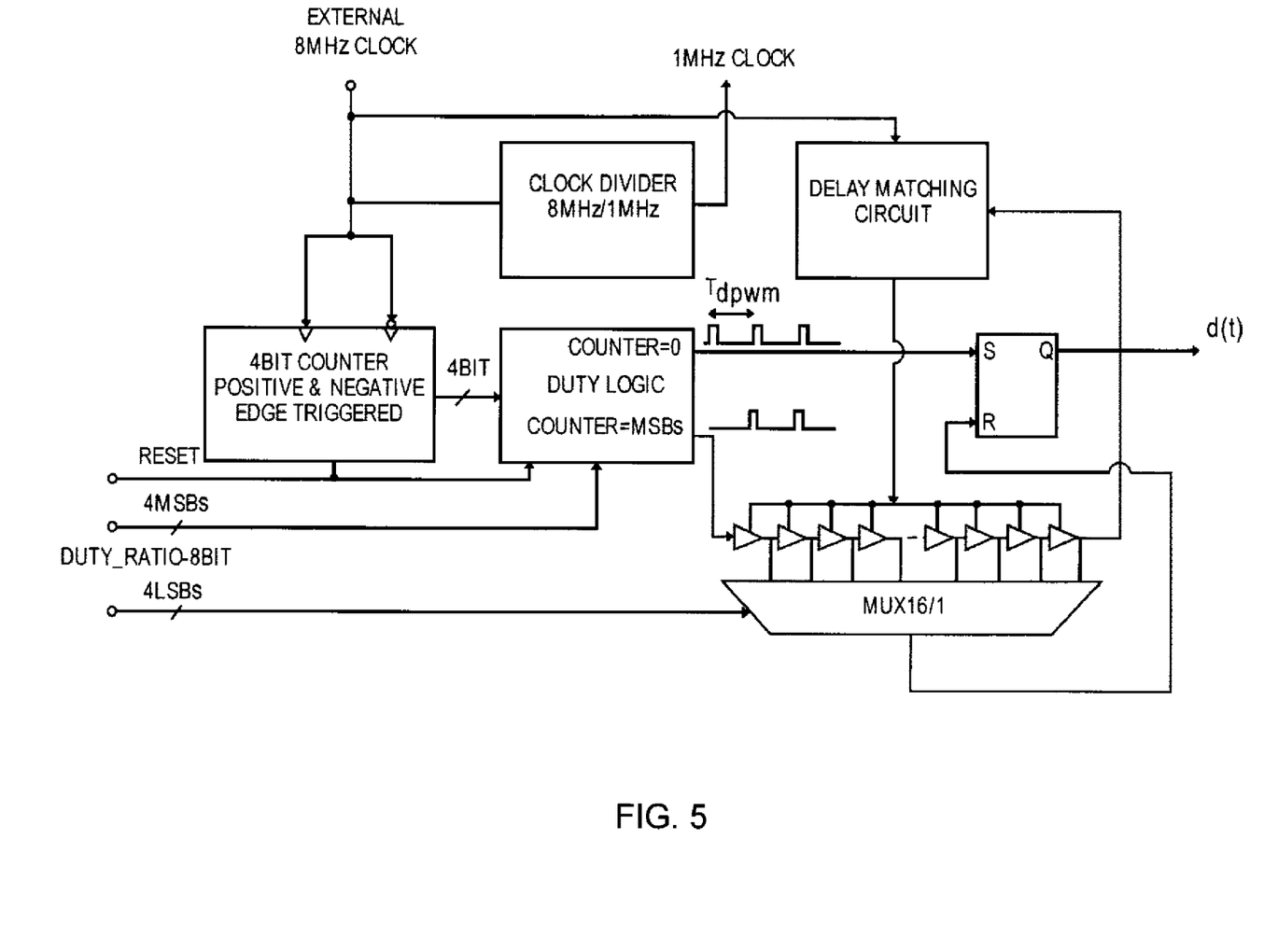
FIG. 5 is a diagram of an eight bit implementation of a digital pulse width modulator of one embodiment.

FIG. 5 shows block diagram of a single-output 8-bit input implementation of one embodiment of the new digital-pulse width modulator of one embodiment.

The DPWM of this example includes a 4-bit ring counter, duty-logic circuit, set of delay cells forming a delay line, multiplexer, delay matching circuit and a set-reset (SR) latch. The duty ratio value of pulse-width modulated signal d(t) is defined through 8-bit Duty_Ratio input d[n], which 4 most significant bits (4-MSBs)=$d_{msb}$[n] are connected to duty logic block and 4 least significant bits (4-LSBs)=$d_{lsb}$[n] are tied to the multiplexer.

The example of FIG. 5 works as follows. At the beginning of each switching cycle 4-bit double-edge triggered counter, which is clocked at the frequency 8-times higher than the desired switching frequency, produces zero at the output. The zero output is detected by duty-ratio logic, which sets the RS latch and the output signal d(t) is high. After $d_{msb}$[n] clock cycles the output of the counter is equal to the 4-MSBs of the input of duty logic, resulting in the creation of a pulse that is passed to delay line, which total delay time is equal to the period of the counter clock signal, and its taps are connected to the multiplexer. When the signal propagating through the delay line reaches the tap selected by 4-LSBs of the input control word the output of multiplexer becomes high and resets the RS latch and output d(t) is low and a pulse which duration is proportional to input d[n] is formed. A new switching cycle starts when the ring counter reaches zero and the RS latch is set again.

Delay matching circuit can dynamically changes the delay of the cells to match to the total delay-line propagation time with a clock period and in that way eliminate nonlinearity problem characteristic for segmented based implementations.

FIG. 6 shows a 4-bit programmable current starved delay cell of one embodiment. The cell includes of a five current mirroring stages that share the same biasing current and are sized in logarithmic fashion (W/L, W/L, 2W/L, 4W/L, and 8W/L). The propagation time of a digital signal passing from input i to the output Out depends on the amount of current discharging the equivalent capacitance seen at node A. Programmable delay time is achieved through delay control input $t_d$[3:0] that changes the number of current mirrored transistors operating in parallel, and hence varies the discharging current. In this case, the faster propagation time (smaller delay) is achieved when the number of conducting transistors is larger. Input r serves to reset the delay cell.

In delay line based structures, the propagation time of a delay cell is not constant. It usually varies due to changes in temperature and IC process variations. In the presented invention as well as in the segmented delay line based DPWM this variation can result in nonlinear or even non-monotonic dependence of the duty ratio value on the input control signal and in unpredictable behavior of digital controller.

The delay-matching block depicted in FIG. 4 dynamically adjusts the propagation time of delay line to compensate process and temperature variations and linearizes the DPWM characteristic. The matching block sets the total propagation time of 16 delay cells to be approximately the same as the period of the DPWM clock signal (see FIG. 2) ensuring that the increase of duty ratio value defined by 4-LSBs of d[n] is always smaller than the smallest increment caused by a change in 4-MSBs of d[n].

As shown in FIG. 4, the system can include a "Half+1 Cell" replica of the delay line, four edge-triggered D flip-flops, a combinatorial logic and a 4-bit register (accumulator). For the case when the DPWM presented in this invention consists of a 4-bit counter and 16:1 MUX, the "Half+1 Cells" replica of the delay line has only nine delay cells, identical to the sixteen cells of the DPWM. At a rising edge of the external clock the start signal is created, and passed through the delay line replica, whose $8^{th}$ and $9^{th}$ cell (N/2 and N/2+1) are connected to two edge triggered flip-flops. Then, at the immediately following negative edge, which occurs after a ½ of clock period, a strobe signal is created and a "snapshot" of the states of the cells 8 and 9 is taken and processed with a simple digital logic. Two zeroes at the outputs of the snapshot flip-flops indicate slower propagation and produce 1 at the output of the digital logic. As a result, the value of delay control register $t_d$[3:0] increases and the speed of cells increases accordingly. Two ones at the input of the digital logic indicate too fast propagation of the signal through delay cells and cause decrease of $t_c$. It is assumed that half periods of DPWM and external clock are equal when the snapshot value is 10 (binary) and the frequency register remains unchanged.

It should be noted that, in this case, an ideal external clock with exact 50% duty ratio is assumed. For the case when a non-ideal clock signal is applied, the present circuit needs minor modification. In that case, the delay line can be replaced with a "full-length+1" replica and start and strobe signal need to be created either with two positive or negative successive edges of the clock signal.

In addition to the previously mentioned and solved problem of the operation with variable number of phases, general problem of all DPWM architectures based on delay cells and required to operate over a wide-range of switching frequency is, again, linearity.

When a good matching between the minimum time increment of the counter and the total propagation time of delay cells is not achieved, a non-monotonic characteristic can occur. As a result, at certain operating points a local positive feedback and stability problems can occur. To eliminate this problem delay-locked loop (DLL) based structures can be implemented. The previously presented implementations of the DLL are not designed for the operation over a wide-range of programmable frequencies, since they relay on delay cells that have constant time increments. Consequently, they cannot be used for the controller structure requiring operation over a wide range of switching frequencies, for example, between 100 kHz and 10 MHz. In this case to achieve an 8-bit resolution, the delay of cell $t_d=1/(2^8 \cdot f_{clk})$ $t_{pd}$ needs to vary between 390.6 ps and 39.06 ns. Conventional current starved delay cells are not suitable for the targeted application either. In the conventional implementation, the power taken by a delay line is proportional to the switching frequency. This is because at higher frequencies a current source having large bias current, linearly proportional to switching frequency, is required to produce a small delay. Meaning that, if conventional cells are used, at the highest frequency the power consumption of the controller would be 100 times higher than at lower frequencies.

Figure 8:
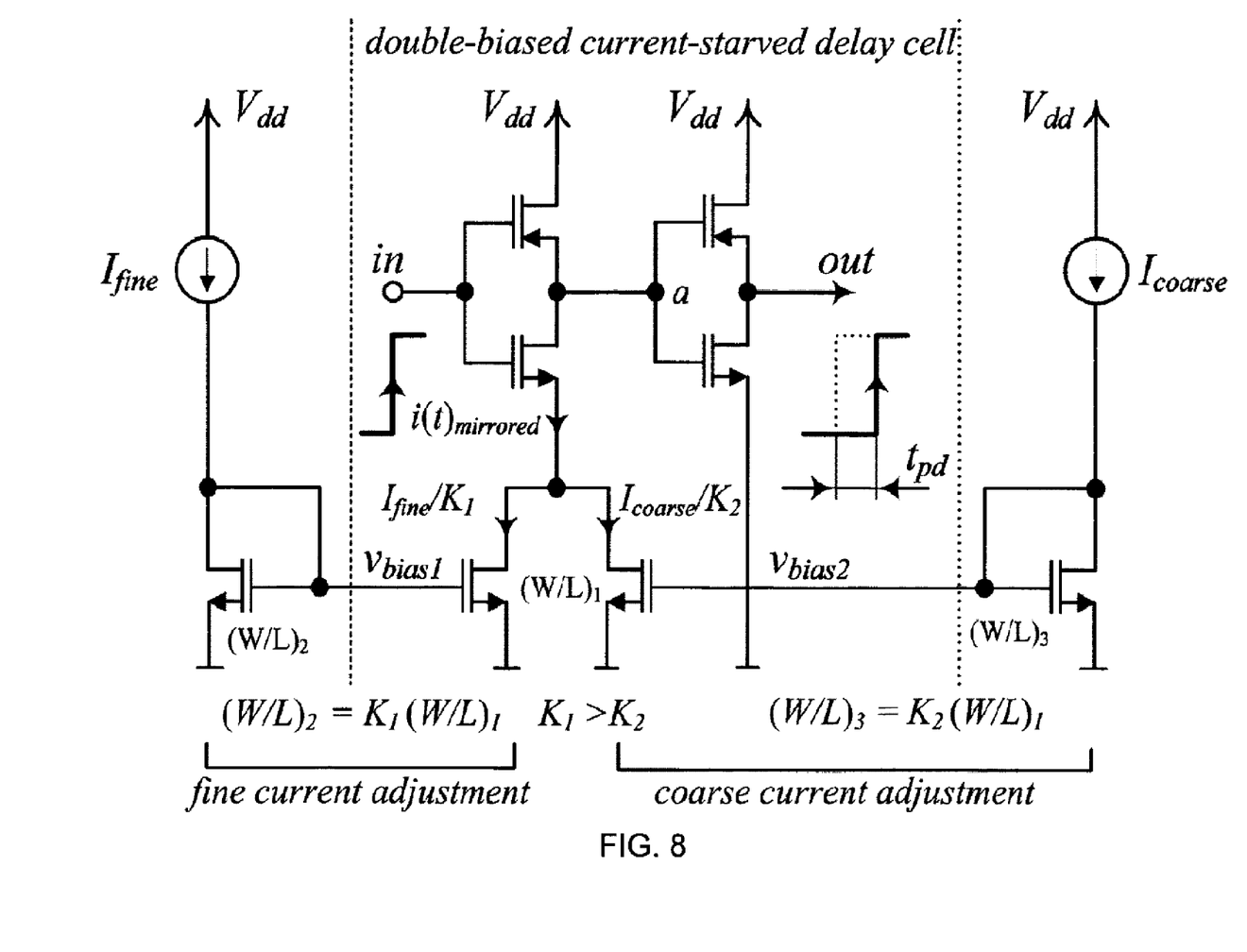
FIG. 8 is a diagram of a dual-biased delay cell having precise adjustment of propagation time over a wide range of operation.

To allow the use of this programmable frequency controller in low-power supplies, which usually operate at higher switching frequencies than the high power systems, and have efficiency strongly dependent on the controller's power consumption, we developed a power efficient dual-bias delay cell, shown in FIG. 8. In one embodiment, the dual-bias delay cell consists of a CMOS inverter and a dual current mirroring input stage that discharges equivalent capacitance seen at the node a. The propagation time of signal entering the cell is inversely proportional to the instantaneous current of the mirroring stage i(t)$_{mirrored}$. This current is formed as a scaled sum of current produced by two sources $I_{coarse}$, $I_{fine}$ and during the delay cell transition period its value is:

$$i(t)_{mirrored} = I_{fine}/K_1 + I_{coarse}/K_2 \qquad (2)$$

where $K_1 > K_2$.

In this way, the need for a single current source having a wide current range and high power consumption, at high switching frequencies, is eliminated. Still, a relatively high current $i(t)_{mirrored}$ ensuring short propagation time of delay cells can be achieved by setting $I_{coarse}$ at a high value. When long propagation times are required, $I_{coarse}$ can be reduced and a precise delay regulation can be achieved through $I_{fine}$ adjustments. It should be noted that, in this application, $i(t)_{mirrored}$ has a relatively small influence on the delay line's power consumption. This is because $i(t)_{mirrored}$ occurs only during short delay-cell state transients, and in the targeted range of switching frequencies its average value is small. This structure also provides more accurate regulation of delay times and significantly lower power consumption than the DPWM structures based on conventional delay lines.

For large delays the conventional current starved delay cells have poor regulation of delay times, due to inaccurate adjustment of low bias currents. In this case, this problem is minimized. Now, since the currents $I_{coarse}$ and $I_{fine}$ do not change over a wide range, precise adjustments of large delays can be achieved by reducing $I_{coarse}$ and by varying $I_{fine}$ only. Current sources $I_{coarse}$ and $I_{fine}$ can be digitally.

The delay matching control logic block is shown in FIG. 2. It compares the propagation time of $\delta(t)$ through 32 delay cells with the DPWM's clock period. If the clock period is larger the bias current of delay cells is decreased and if it is faster $i(t)_{mirrored}$ is increased.

Figure 9:
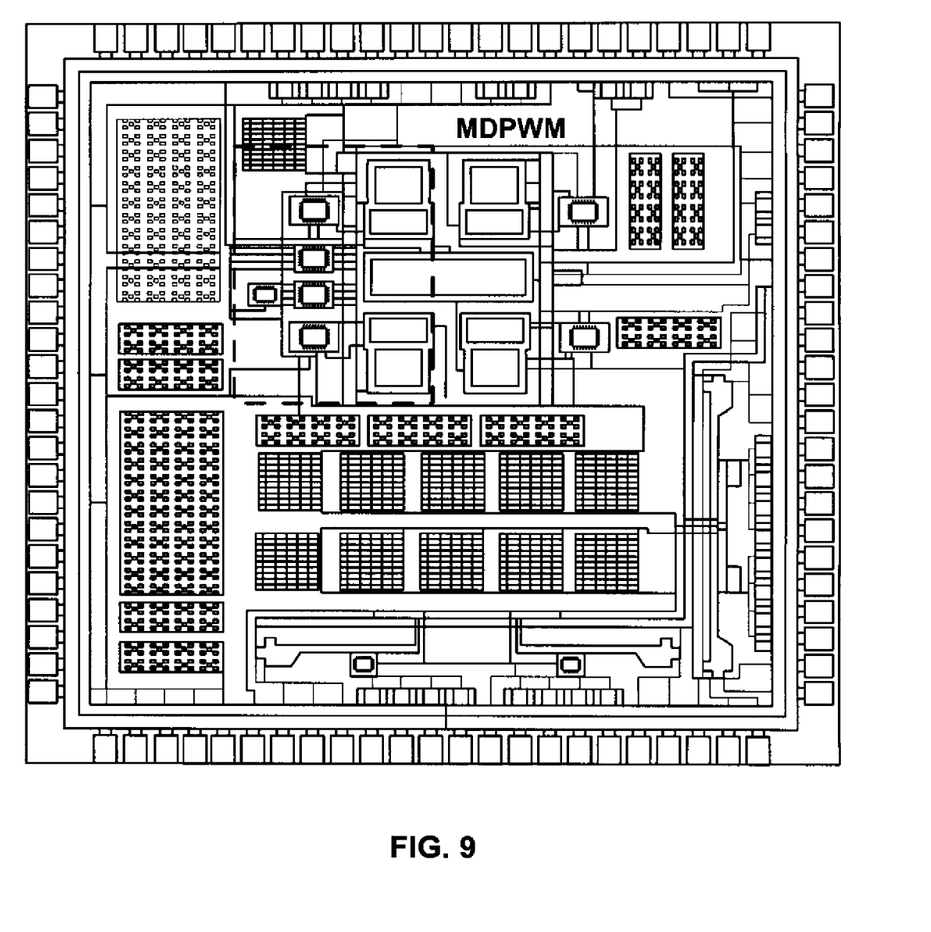
FIG. 9 is a diagram of an experimental IC developed for practical verification of the invented concepts.

To experimentally verify the effectiveness of the new methods and architecture described in this invention a MDPWM controller was implemented on a chip, in a standard 0.18 μm process, using mixed-signal design approach. The largest portion of the circuit, taking more than 80% of silicon area is digital. It was constructed with automated design tools starting from Verilog code. The analog portion of the design includes input differential stages of ADCs, delay-lines both for ADCs and MDPWM and bias circuits for MDPWM. FIG. 9 shows layout of the chip and Table I gives a summary of its main characteristics. It can be seen that it takes relatively small silicon area and has very low power consumption, comparable to the state of the art analog solutions.

TABLE I

| Important Chip Parameters | |
|---|---|
| MDPWM | Frequency: 100 KHz to 10 MHz |
| | Effective Resolution: 11-bits |
| | Hardware resolution: 8-bits |
| | Silicon area: 0.435 mm² |
| ADC | Conversion time: 35 ns |
| | Quantization step: 20 mV/10 mV |
| | Silicon area: 0.052 mm² |
| Current Consumption | 1.8 mA @ 10 MHz (VDD = 1.8 V) |

Figure 10:
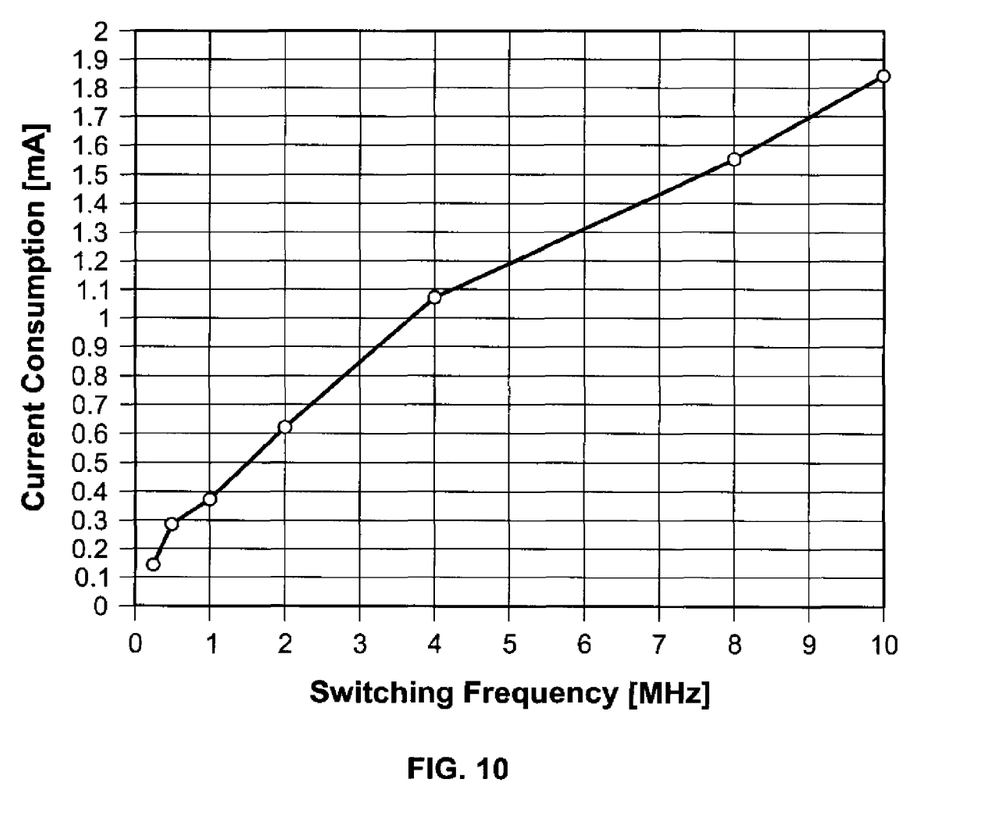
FIG. 10 is a diagram that shows current consumption of the chip of FIG. 9 over a wide range of switching frequencies.

The results of the chip's current consumption measurement for a constant 1.8 V supply voltage and change of switching frequency between 100 kHz and 10 MHz are shown in FIG. 10. They verify that a significant reduction of power consumption with the use of the new structure can be achieved. Although the switching frequency is increased 100 times the current intake, i.e. power consumption, of the chip has increased only 12 times, from 0.15 mA to 1.8 mA. This allows the use of this invention not only in high power systems but also in low-power SMPS used in portable electronics where the power taken by the controller IC has very significant influence on the overall efficiency of the system and is desired to be as small as possible.

The foregoing description of preferred embodiments of the present invention has been provided for the purposes of illustration and description. It is not intended to be exhaustive or to limit the invention to the precise forms disclosed. Many embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the claims and their equivalents.

What is claimed is:

1. A delay cell using dual bias to control a delay of a signal through the delay cell, the delay cell comprising:
    coarse current bias control circuitry
    fine current bias control circuitry, wherein the coarse current bias control circuitry and fine current bias control circuitry combine to produce a combined mirrored current.

2. The delay cell of claim 1, wherein in a propagation time through the delay cell is inversely proportional to the mirrored current.

3. The delay cell of claim 1, where a first current provided by the coarse current bias control circuitry has a greater proportional contribution to the mirrored current than the a first current provided by fine current bias control circuitry.

4. The delay cell of claim 1, wherein the delay cell is a current starved delay cell.

5. The delay cell of claim 1, wherein the coarse current bias control circuitry includes a first current mirror and wherein the fine current bias control circuitry includes a second current mirror and wherein the first and second current mirror produce the combined mirrored current.

6. The delay cell of claim 5, wherein the first current mirror includes a first transistor with its gate connected to its drain and wherein the second current mirror includes a second transistor with its gate connected to its drain, wherein the second transistor has an aspect ratio (W/L) that is greater than the aspect ratio of the first transistor.

7. A delay cell using dual bias to control a delay of a signal through the delay cell, the delay cell comprising:
    coarse current bias control circuitry
    fine current bias control circuitry, wherein a large delay adjustment can be made by varying the fine current control circuitry without adjusting the coarse current control circuitry.

8. The delay cell of claim 7, wherein the coarse current bias control circuitry includes a first current mirror and wherein the fine current bias control circuitry includes a second current mirror.

9. The delay cell of claim 8, wherein the first current mirror includes a first transistor with its gate connected to its drain and wherein the second current mirror includes a second transistor with its gate connected to its drain, wherein the second transistor has an aspect ratio (W/L) that is greater than the aspect ratio of the first transistor.

10. A delay cell using dual bias to control a delay of a signal through the delay cell, the delay cell comprising:
    coarse current bias control circuitry
    fine current bias control circuitry; wherein the dual bias reduces the current consumption at high switching frequencies.

11. The delay cell of claim 10, wherein the coarse current bias control circuitry includes a first current mirror and wherein the fine current bias control circuitry includes a second current mirror.

12. The delay cell of claim 11, wherein the first current mirror includes a first transistor with its gate connected to its drain and wherein the second current mirror includes a second transistor with its gate connected to its drain, wherein the second transistor has an aspect ratio (W/L) that is greater than the aspect ratio of the first transistor.

13. A multi-phase digital pulse width modulator (DPWM) whose power consumption does not linearly increase with switching frequency, allowing significant power savings and improving efficiency of low-power switch-mode power supplies operating at high frequencies, wherein the DPWM has dual biased delay cells, the dual bias delay cells including coarse current bias control circuitry, fine current bias control circuitry; and
wherein the coarse current bias control circuitry and fine current bias control circuitry combine to produce a combined mirrored current.

14. The DPWM of claim 13, wherein the DPWM is multiphased.

15. The DPWM of claim 13, wherein the dual biased delay cells are current starved delay cells.

16. The DPWM of claim 13, wherein the coarse current bias control circuitry includes a first current mirror and wherein the fine current bias control circuitry includes a second current mirror and wherein the first and second current mirror produce the combined mirrored current.

17. The DPWM of claim 16, wherein the first current mirror includes a first transistor with its gate connected to its drain and wherein the second current mirror includes a second transistor with its gate connected to its drain, wherein the second transistor has an aspect ratio (W/L) that is greater than the aspect ratio of the first transistor.

* * * * *